United States Patent
Asano et al.

(10) Patent No.: US 6,627,956 B2
(45) Date of Patent: Sep. 30, 2003

(54) SEMICONDUCTOR SWITCHING DEVICE

(75) Inventors: Tetsuro Asano, Ora-gun (JP);
Toshikazu Hirai, Ora-gun (JP); Mikito Sakakibara, Oosato-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/163,873

(22) Filed: Jun. 7, 2002

(65) Prior Publication Data

US 2002/0185667 A1 Dec. 12, 2002

(30) Foreign Application Priority Data

Aug. 6, 2001 (JP) ........................................ 2001-173498

(51) Int. Cl.[7] .......................... H01L 23/62; H01L 29/33; H01L 29/06; H01L 31/0328; H01L 31/0336; H01L 31/072; H01L 31/109; H01L 21/3205; H01L 21/4763; H04B 1/44

(52) U.S. Cl. ........................ 257/358; 257/357; 257/360; 257/20; 257/24; 257/27; 257/192; 257/210; 438/590; 455/78; 455/83

(58) Field of Search ............................ 257/282, 27, 73, 257/192, 260, 280, 281, 459, 734, 779, 20, 24, 210, 590, 57, 71, 133, 138, 213, 267, 270, 358, 357, 360; 438/167, 135, 570, 149, 151, 157, 166, 193, 195, 284, 385, 590; 455/78, 83, 575

(56) References Cited

U.S. PATENT DOCUMENTS

| | | | |
|---|---|---|---|
| 4,810,911 A | * | 3/1989 | Noguchi ..................... 327/431 |
| 5,317,290 A | | 5/1994 | Jacomb-Hood |
| 5,497,118 A | * | 3/1996 | Ueno et al. .................. 327/416 |
| 6,118,985 A | * | 9/2000 | Kawakyu et al. ............. 455/78 |
| 6,573,529 B2 | * | 6/2003 | Asano et al. .................. 257/20 |
| 6,580,107 B2 | * | 6/2003 | Higashino et al. .......... 257/282 |

FOREIGN PATENT DOCUMENTS

| | | |
|---|---|---|
| EP | 0 766 396 | 4/1997 |
| EP | 1 156 530 | 11/2001 |

OTHER PUBLICATIONS

Singh et al., "Integrated Digitally Controlled 6–Bit Phase Shifter, 4–Bit Attenuator, and T/R Switch Using Multifunction Self Aligned Gate Process" IEEE 1991 Microwave and Millimeter–Wave Monolithic Circuits Symposium, 3/91.

Johnson et al., "Silicon–on–Sapphire MOS FET Transmit/Receive Switch for L and S Band Transceiver Applications" Electronics Letters, Jul. 17, 1997, vol. 33, No. 15.

Uda et al., "High–Performance GaAs Switch ICs Fabricated Using MESFETs with Two Kinds of Pinch–off Voltages" GaAs IC Symposium, pp. 247–250, 1993.

* cited by examiner

*Primary Examiner*—Nathan J. Flynn
*Assistant Examiner*—Victor A. Mandala, Jr.
(74) *Attorney, Agent, or Firm*—Morrison & Foerster LLP

(57) ABSTRACT

A semiconductor switching device of mirror logic includes two FETs having a gate width of 600 $\mu$m, a common input terminal, two control terminal and two output terminals. The resistors connecting the control terminals and the gate electrodes of FETs are placed underneath a pad metal layer extending from the common input terminal. Both FETs extend into the space between the control terminals and the output terminals. The device can be housed in the same package as the device of non-mirror logic.

12 Claims, 6 Drawing Sheets

PRIOR ART

SEMICONDUCTOR SWITCHING DEVICE

BACKGROUND OF THE INVENTION

1. Field of the Invention

The invention relates to a semiconductor switching device for switching at high frequencies, specifically to a compound semiconductor switching device operating at frequencies equal to or higher than 2.4 GHz.

2. Description of the Related Art

Mobile communication devices such as mobile telephones often utilize microwaves in the GHz range, and commonly need switching devices for high frequency signals which are used in switching circuits for changing antennas and switching circuits for transmitting and receiving such signals. A typical example of such a switching device can be found in Japanese Laid-Open Patent Application No. Hei 9-181642. Such a device often uses a field-effect transistor (called FET hereinafter) formed on a gallium arsenide (GaAs) substrate, as this material is suitable for use at high frequencies. Developments have been made in forming a monolithic microwave integrated circuit (MMIC) by integrating the aforementioned switching circuits.

FIG. 1A is a cross-sectional view of a conventional GaAs FET. The GaAs substrate 1 is initially undopped, and has an n-type channel region (or a channel layer) 2 formed by doping with n-type dopants beneath its surface. A gate electrode 3 is placed on the surface of the channel region 2, forming a Schottky contact. A source electrode 4 and a drain electrode 5 are placed on both sides of the gate electrode 3, forming ohmic contacts to the surface of the channel region 2. In this transistor configuration, a voltage applied to the gate electrode 3 creates a depletion layer within the channel region 2 beneath the gate electrode 3 and, thus, controls the channel current between the source electrode 4 and the drain electrode 5.

FIG. 1B shows the basic circuit configuration of a conventional compound semiconductor switching device called an SPDT (Single Pole Double Throw) switch, using GaAs FETs. The source electrode (or the drain electrode) of each FET (FET1 and FET2) is connected to a common input terminal IN. The drain electrode (or source electrode) of each FET (FET1 and FET2) is connected to respective output terminals (OUT1 and OUT2). The gates of FET1 and FET2 are connected to the control terminals Ctl-1, Ctl-2 through resistors R1, R2, respectively. A pair of complementary signals is applied to the two control terminals, Ctl-1, Ctl-2. When a high level signal is applied to the control terminal of one of the FETs, the FET switches on, and a signal fed to the common input terminal IN passes through the FET and reaches one of the output terminals OUT1, OUT2. The role of the resistors R1 and R2 is to prevent leakage of the high frequency signals through the gate electrodes to the DC voltages applied to the control terminals Ctl-1, Ctl-2, which are substantially grounded at a high frequency.

The switching device shown in FIG. 1B must have shunts, which lead leaking signals to the ground, in order to attain a high degree of isolation. Alternatively, the gate width may be reduced to about 600 μm without utilizing shunts so that the overall size of the switching device is reduced with proper isolation, as described in commonly owned copending U.S. patent application Ser. No. 09/855,030, entitled "COMPOUND SEMICONDUCTOR DEVICE FOR SWITCHING." The disclosure of U.S. patent application Ser. No. 09/855,030 is, in its entirety, incorporated herein by reference.

In the switching device configuration of FIG. 1B, the control terminal Ctl-1 is connected via the resistor R1 to the gate of FET 1, which is the closer of the two FETs to the control terminal Ctl-1. In the same manner, the control terminal Ctl-2 is connected via the resistor R2 to the gate of FET2. However, some device designs call for a configuration in which the control terminal Ctl-1 is connected to the gate of FET2, which is the further of the two FETs from the control terminal Ctl-1. The control terminal Ctl-2 is connected to the gate of FET1, which is the further of the two FETs from the control terminal Ctl-2. This configuration will be referred to as a mirror configuration hereinafter. Because in the mirror configuration the wiring and resistor connecting the control terminal and the gate electrode are disposed in the peripheral portion of the chip to detour around the elements of switching device, size reduction gained by the device configuration with 600 μm gate-width FET is somewhat sacrificed.

SUMMARY OF THE INVENTION

The invention provides a semiconductor switching device including a first field effect transistor and a second field effect transistor. Each of the transistors comprises a source electrode, a gate electrode and a drain electrode which are formed on the channel layer of the respective transistor. A common input terminal is connected to the source electrode or the drain electrode of the first transistor and is also connected to the source electrode or the drain electrode of the second transistor. A first output terminal is connected to the source electrode or the drain electrode of the first transistor which is not connected to the common input terminal. A second output terminal is connected to the source electrode or the drain electrode of the second transistor which is not connected to the common input terminal. The switching device also includes a first control terminal and a second control terminal. A first resistor connects the second control terminal and the gate electrode of the first transistor. A second resistor connects the first control terminal and the gate electrode of the second transistor. In this configuration, the gate electrodes of the first transistor and the second transistor receive control signals so that one of the transistors opens as a switching element and the other transistor closes as another switching element. At least a portion of the first resistor and at least a portion of the second resistor are disposed underneath the pad metal layer. At least a portion of the first resistor and at least a portion of the second resistor are disposed between the first and second transistors and the common input terminal.

The invention also provides a semiconductor switching device including a first field effect transistor and a second field effect transistor. Each of the transistors comprises a source electrode, a gate electrode and a drain electrode which are formed on the channel layer of the respective transistor. A common input terminal is connected to the source electrode or the drain electrode of the first transistor and is also connected to the source electrode or the drain electrode of the second transistor. A first output terminal is connected to the source electrode or the drain electrode of the first transistor which is not connected to the common input terminal. A second output terminal is connected to the source electrode or the drain electrode of the second transistor which is not connected to the common input terminal. The switching device includes a first control terminal and a second control terminal. A first resistor connects the second control terminal and the gate electrode of the first transistor. A second resistor connects the first control terminal and the gate electrode of the second transistor. In this configuration, the gate electrodes of the first transistor and the second transistor receive control signals so that one of the transistors opens as a switching element and the other transistor closes as another switching element. At least a portion of the first resistor and at least a portion of the second resistor are disposed between the first and second transistors and the common input terminal. The first control terminal and the first output terminal are disposed closer to the first transistor than the second transistor. The second control terminal and the second output terminal are disposed closer to the second transistor than the first transistor. A portion of the first transistor is disposed between the first control terminal and the first output terminal, or a portion of the second transistor is disposed between the second control terminal and the second output terminal.

DETAILED DESCRIPTION OF THE INVENTION

An embodiment of this invention will be described hereinafter with reference to the FIGS. 2–6.

Figure 1A:
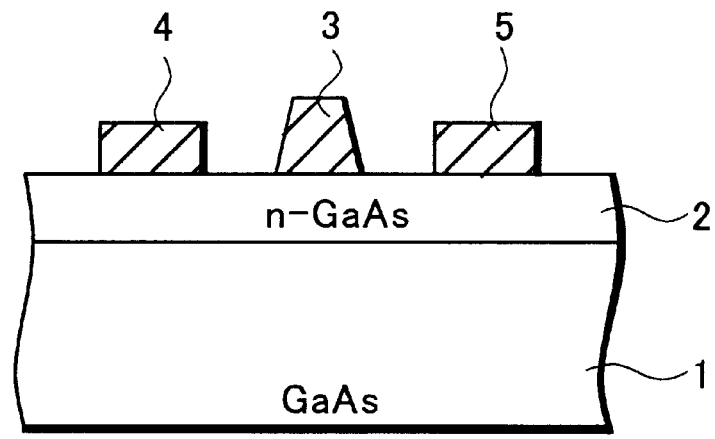
FIG. 1A is a cross-sectional view of a conventional switching device.
Figure 1B:
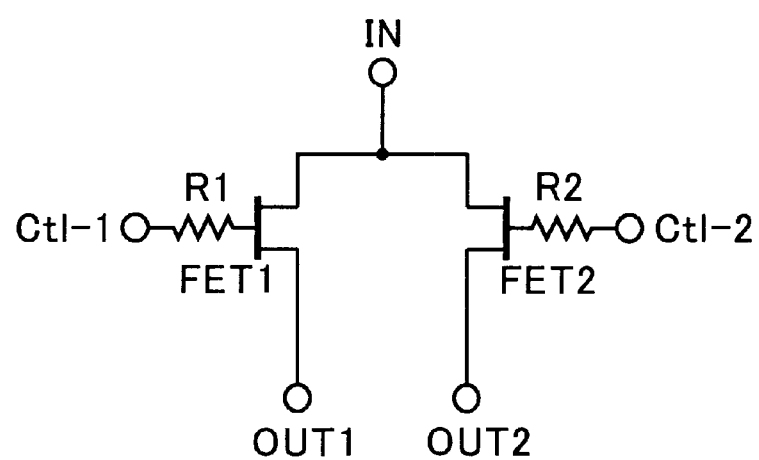
FIG. 1B is a circuit diagram of a conventional SPDT switch.
Figure 2:
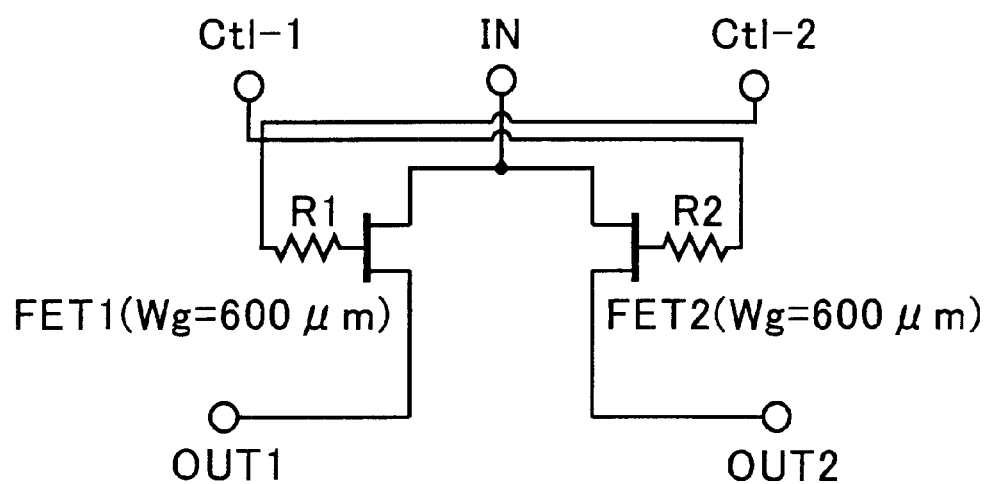
FIG. 2 is a circuit diagram of the semiconductor switching circuit device of the first and second embodiments of this invention.

FIG. 2 is a circuit diagram of a semiconductor switching circuit device of a first embodiment of this invention, which has a mirror configuration. The device has first and second FETs (FET1, FET2), each of which has a source electrode, a gate electrode and a drain electrode on its channel layer. The device also has a common input terminal IN connected to the source electrodes (or the drain electrodes) of the FETs (FET1, FET2), a first output terminal OUT1 connected to the drain electrode (or the source electrode) of the first FET (FET1), and a second output terminal OUT2 connected to the drain electrode (or the source electrode) of the second FET (FET2). The gate electrode of FET1 is connected to a control terminal Ctl-2 via resistor R1, and the gate electrode of FET2 is connected to a control terminal Ctl-1 via resistor R2. A pair of complementary signals is applied to the control terminals Ctl-1, Ctl-2 so that one of FET1 and FET2, which receives an H-level signal, turns on and connects the common input terminal and the output terminal connected to the FET, and the other of FET1 and FET2, which receives an L-level signal, remains turned off. In other words, the FET receiving the H-level signal opens as a switching element and the FET receiving the L-level signal closes as another switching element. The resistors R1, R2 prevent leakage of high frequency signals from the gate electrodes to the control terminals Ctl-1, Ctl-2.

Because of the mirror configuration of the switching device, when a signal is passed through the first output terminal OUT1, the second control terminal Ctl-2, which is further away from the first output terminal OUT1 than the first control terminal Ctl-1, has to receive a high signal, for example, 3 volts, and the first control terminal Ctl-1, which is closer to the first output terminal OUT1 than the second control terminal Ctl-2, has to receive a low signal, for example, 0 volts. Similarly, when a signal is passed through the second output terminal OUT2, the first control terminal Ctl-1, which is further away from the second output terminal OUT2 than the second control terminal Ctl-2, has to receive the high signal, and the second control terminal Ctl-2, which is closer to the second output terminal OUT2 than the first control terminal Ctl-1, has to receive the low signal.

Figure 3:
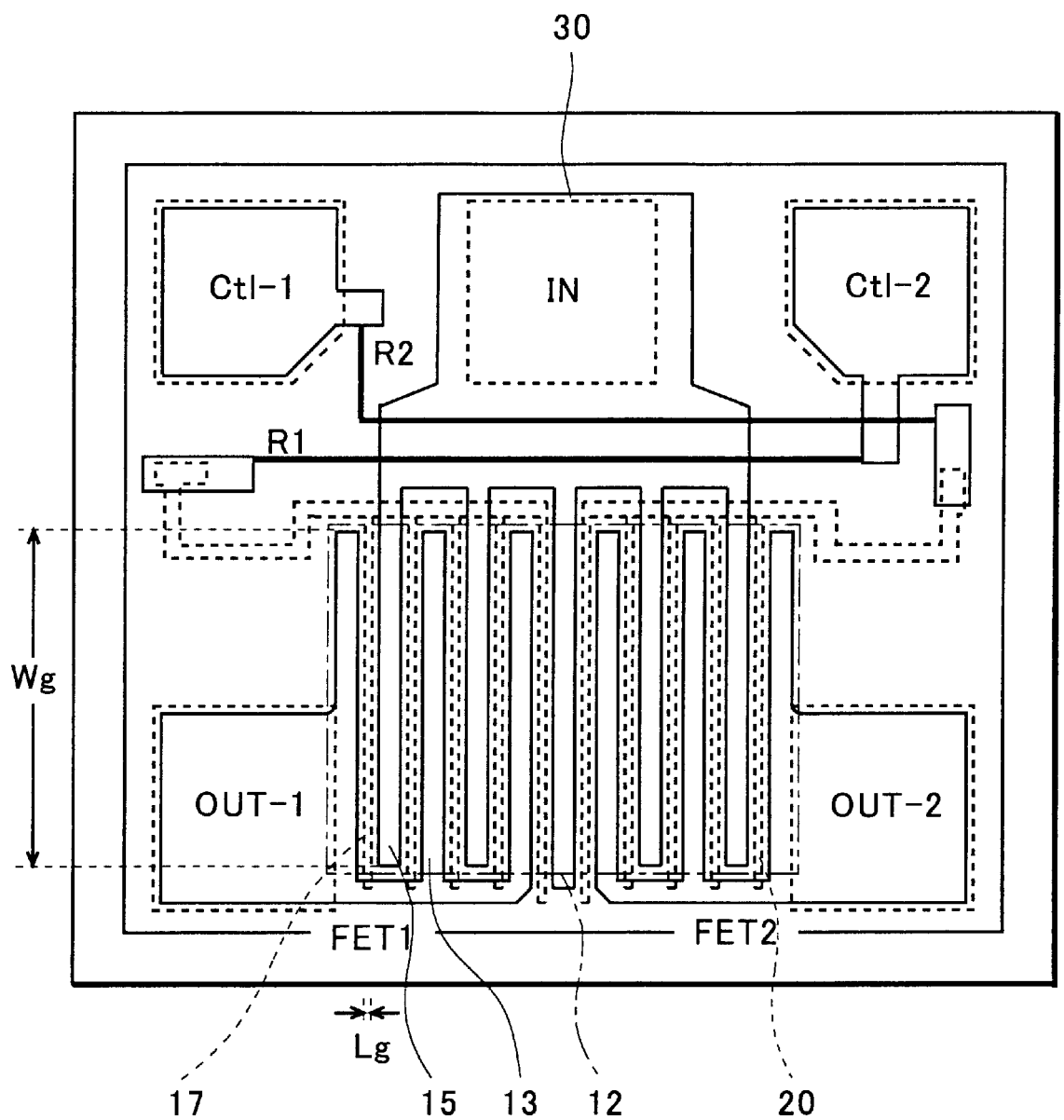
FIG. 3 is a plan view of a switching device of the first embodiment in which the circuit of FIG. 2 is integrated as a chip.

FIG. 3 shows a first embodiment of the semiconductor switching device of this invention integrated as a compound semiconductor chip, based on the circuit design with the mirror configuration of FIG. 2. The two switching FETs (FET1 on the left, FET2 on the right) occupy the central portion of a GaAs substrate. Resistors R1, R2 are connected to the gates of the two respective FETs. The terminals, IN, OUT1, OUT2, Ctl-1, Ctl-2 occupy a significant area of the substrate surface as connecting pads so that the connecting pads surround the two FETs. The dashed lines indicate a second layer of wiring which is formed in the same processing step as the gate electrodes of the FET and is made of a gate metal layer (Ti/Pt/Au) 20. A third layer of wiring indicated by the solid lines is for connecting the device elements and forming the connecting pads, and is made of a pad metal layer (Ti/Pt/Au) 30. A first layer contains an ohmic metal layer (AuGe/Ni/Au) 10 making an ohmic contact with the substrate, which forms the source electrode, the drain electrode and electrodes for the resistors. In FIG. 3, the first layer is not shown, as it overlaps with the pad metal layer.

The resistor R2 extends from the first control terminal Ctl-1, goes underneath the pad metal layer 30 extending from the common input terminal IN, and reaches a wiring layer connected to the gate electrodes 17 of FET2. Likewise, the resistor R1 extends from the second control terminal Ctl-2, goes underneath the pad metal layer 30 extending from the common input terminal IN, and reaches a wiring layer connected to the gate electrodes 17 of FET1. The resistors R1, R2 are made of an n+ impurity region and disposed under the pad metal layer 30 with a nitride film insulating the resistors from the pad metal layer 30.

Figure 5:
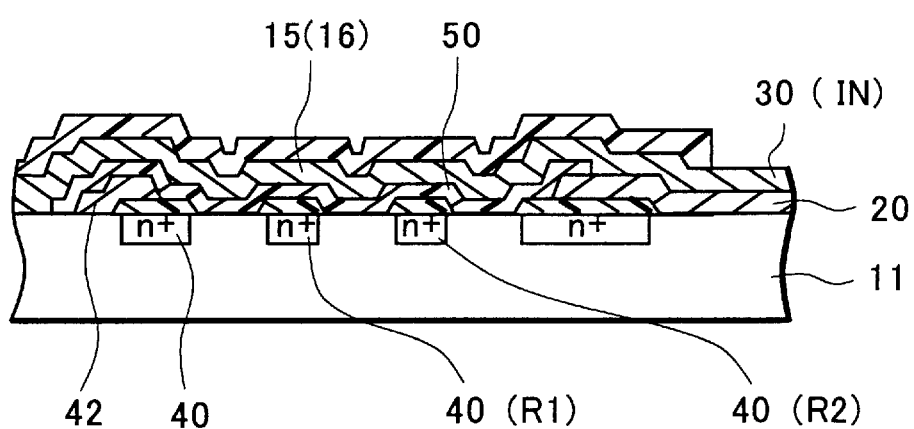
FIG. 5 is a cross-sectional view of the switching device of the second embodiment cut along line A—A in FIG. 4.

The wiring layer, which is denoted by reference numeral 42 in FIG. 5, is the portion of the gate metal layer 20 which is not the gate electrode of the FETs or the lower layer of the connecting pads, which will be described later with reference to FIG. 5. The wiring layer serves as a connection among the teeth of the combs (gate electrodes 17) and a connection between the connected gate electrodes 17 and the resistors.

In FET2 of FIG. 3, the rectangle area 12 denoted by the unevenly broken line shows the channel layer formed on a GaAs substrate 11. The source electrode 13 (or the drain electrode) is made of the pad metal layer (Ti/Pt/Au) 30 as the third layer extending from the bottom side of the drawing, has a comb-like structure having three teeth, and is connected to the output terminal OUT2. The source electrode (or the drain electrode) which is made of the ohmic metal layer (AuGe/Ni/Au) 10 as the first layer (not shown) is formed underneath the source electrode 13. The drain electrode 15 (or the source electrode) is made of the pad metal layer (Ti/Pt/Au) 30 as the third layer extending from the top side of the drawing, has a comb-like structure having three teeth, and is connected to the common input terminal IN.

The drain electrode (or the source electrode) which is made of the ohmic metal layer (AuGe/Ni/Au) 10 as the first layer (not shown) is formed underneath the drain electrode 15. The source electrode 13 and the drain electrode 15 are juxtaposed in an interleaved relationship to each other, and five gate electrodes 17, which are made of the gate metal layer 20 as the second metal layer, are formed between the teeth of the combs on the channel region 12, creating another comb-like structure. In this configuration, the gate width Wg of FET2 is defined as the summation of the lengths of the gate electrode 17 within the channel layer 12 of FET2. In the construction of FIG. 3, the total length of the five teeth of the gate electrode comb-like structure 17 constitutes the gate width Wg of FET2. In this embodiment, the gate width is 600 μm for both FET1 and FET2. Both FET1 and FET2 have a gate length Lg of 0.5 μm. The middle tooth of the drain electrode 15 is shared by FET1 and FET2 to save space on the substrate.

Because the resistors R1, R2 do not need extra space to detour around the elements of the switching device, this mirror configuration design is efficient in keeping device size small. For example, when the resistors R1, R2 are disposed in the peripheral portion of the chip to detour the device elements, it is expected that chip size increases from the conventional non-mirror configuration by 50 μm (25 μm on each side) in the X direction (the longitudinal direction of the resistors) and by 50 μm in the Y direction (the longitudinal direction of the gate electrode 17). In comparison, the device design of FIG. 3 can avoid such a size increase at least in the X direction.

Figure 4:
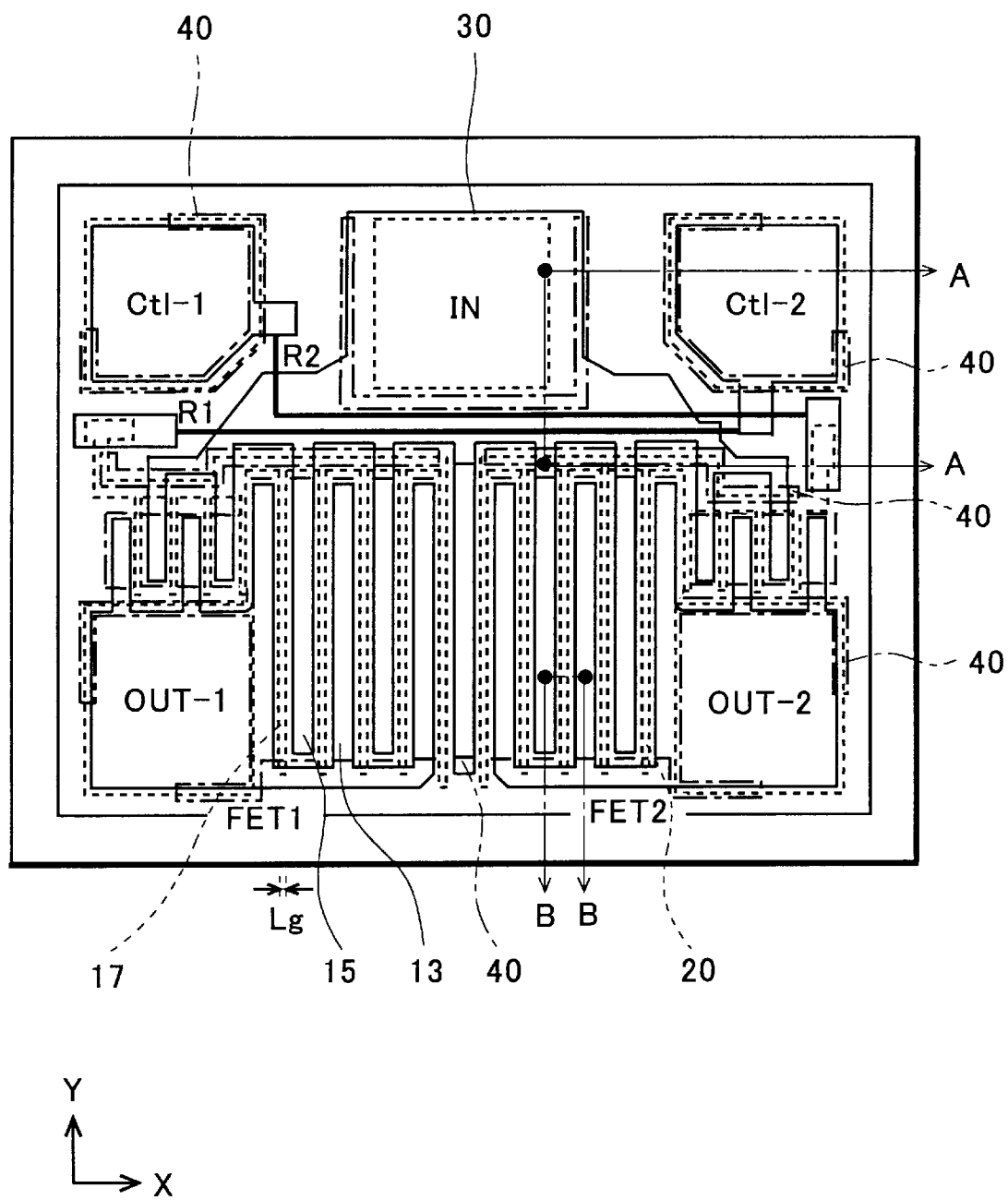
FIG. 4 is a plan view of a switching device of the second embodiment in which the circuit of FIG. 2 is integrated as a chip.

FIG. 4 shows a second embodiment of the semiconductor switching device of this invention integrated as a compound semiconductor chip, based on the circuit design with the mirror configuration of FIG. 2. Most of the device design is similar to that of the first embodiment. The difference is, however, that a portion of FET1 is disposed between the first control terminal Ctl-1 and the first output terminal OUT-1, and a portion of FET2 is disposed between the second control terminal Ctl-2 and the second output terminal OUT2. This design allows further size reduction in the Y direction, in comparison to the design of the first embodiment, by expanding the two FETs in the X direction while keeping the same gate width as the device of the first embodiment.

FET2 in FIG. 4 is expanded into the space between the second control terminal Ctl-2 and the second output terminal OUT2. Each of the source electrode 13 and the drain electrode 15 has five teeth, rather than three. Nine teeth of gate electrode 17 are placed between the source electrode 13 and the drain electrode 15. In this configuration, the gate width Wg of FET2, the summation of the lengths of the gate electrode 17 within the channel layer 12 of FET2, remains 600 μm even though FET2 is reduced in the Y direction. FET2 has a gate length Lg of 0.5 μm. FET1 also has a gate width of 600 μm and a gate length Lg of 0.5 μm. The middle tooth of the drain electrode 15 is shared by FET1 and FET2 to save space on the substrate.

As is the case with the first embodiment, the resistor R2 extends from the first control terminal Ctl-1, goes underneath the pad metal layer 30 extending from the common input terminal IN, and reaches a wiring layer connected to the gate electrodes 17 of FET2. The resistor R1 extends from the second control terminal Ctl-2, goes underneath the pad metal layer 30 extending from the common input terminal IN, and reaches a wiring layer connected to the gate electrodes 17 of FET1. The resistors R1, R2 are made of an n+ impurity region and disposed under the pad metal layer 30 with a nitride film insulating the resistors from the pad metal layer 30.

Resistors R1, R2 are made of n+ impurity region 40 and formed at the same time as the source and drain regions. The n+ impurity region 40 is also formed underneath the connecting pads, i.e. the common input terminal IN, the control terminals Ctl-1, Ctl-2 and the output terminals OUT1, OUT2. As indicated by the unevenly broken line in FIG. 4, the n+ impurity region 40 is formed only at the peripheral portions of the connecting pads. Alternatively, the n+ impurity region may be formed to cover the entire bottom surface of each of the connecting pads of FET1 and FET2. All of the n+ impurity region 40 is formed at the same time as the formation of source and drain regions.

FIG. 4 also shows a wiring layer of the switching device of this embodiment. The wiring layer, which is denoted by reference numeral 42 in FIG. 5, is the portion of the gate metal layer 20 which is not the gate electrode of the FETs or the lower layer of the connecting pads, which will be described later with reference to FIG. 5. The n+ impurity region 40 is also formed underneath the wiring layer at its peripheral portions. In this embodiment, a portion of the bottom surface of the wiring layer is covered by the n+ impurity region 40, as indicated by the unevenly-broken line on the upper portion of the FETs. Alternatively, the n+ impurity region 40 may be formed to cover the entire bottom surface of the wiring layer. As described later, the presence of this n+ impurity region 40 allows for separation among the connecting pads, wiring layers and resistors to be reduced to 4 μm, which is the minimum separation to assure an isolation of 20 dB.

Experiments have shown that the separation of 4 μm among the connecting pads, the wiring layers and the resistors is sufficient to provide an isolation of 20 dB. An electromagnetic simulation also indicated that an isolation as high as 40 dB could be obtained at 2.4 GHz when a separation of 4 μm is provided. The role of the n+ impurity region 40 is not clear. However, it is likely that the n+ impurity region 40 can prevent a depletion layer in a GaAs substrate from extending to a neighboring electrode and thus eliminate leaking of high frequency signal to such an electrode. This observation is based on an experimental finding that a semi-insulating GaAs substrate has a limited breakdown strength, contrary to the common belief in the art.

The configuration of the resistors R1, R2, the nitride film and the metal pad layer 30 is described hereinafter with reference to FIG. 5. FIG. 5 is a cross-sectional view of the switching device of the second embodiment cut along lie A—A of FIG. 4. The common input terminal IN includes a lower electrode, which is made of the gate metal layer 20, and an upper electrode, which is made of the pad metal layer 30. Only the pad metal layer 30 extends to and connects with the drain electrode 15 of FET2. The n+ impurity region 40 is formed underneath the gate metal layer of the common input terminal IN. As described earlier with reference to FIG. 4, the n+ impurity region 40 is formed only at the peripheral portion of the common input terminal IN in this embodiment.

The resistors R1, R2 are made of the same n+ impurity region 40 as the one formed underneath the connecting pads. The conductivity of the n+ impurity region 40 is the same within the chip and the resistance of the resistor portion is defined only by the length of the resistor. Nitride layers 50 are formed between the pad metal layer 30 extending from the common input terminal IN and the resistors R1, R2 formed in the GaAs substrate. There is a thin oxide film provided on the n+ impurity region 40 forming the resistor. The upper most surface of the device is also covered with a nitride film.

The wiring layer 42 made of the gate metal layer 20 is also formed on the substrate 11. This is the portion of the gate metal layer 20 which connects the five teeth of the gate electrode comb of FET2. As described earlier with reference to FIG. 4, the n+ impurity region 40 is formed only at the peripheral portion of the wiring layer 42 in this embodiment.

The n+ impurity region 40 may cover the entire bottom surface of the connecting pad or the wiring layer. The only requirement for this configuration is that the high frequency signal applied to the wiring layer 42 is prevented from reaching to the connecting 20 pad. Substantially the same configuration applies to other connecting pads, i.e. Ctl-1, Ctl-2, OUT1, OUT2.

In the switching device of FIG. 4, the n+ impurity region 40 is formed in the substrate 11 underneath all the connecting pads. Therefore, unlike the substrate 11 with no impurity doped (although it is semi-insulating, the resistance rate of the substrate is $1 \times 10^7$ Ωcm), the impurity concentration of the n+ impurity region 40 is high (the type of ion is $^{29}Si^+$, and the concentration is $1-5 \times 10^{18}$ cm$^{-3}$), and the depletion layer around the connecting pads does not expand. Thus, the separation among the pads and the neighboring wiring layers can be reduced to 4 μm, which still ensures an isolation of 20 dB.

Furthermore, the common input terminal IN has the impurity region 40 along all its sides except the topside. The output terminals OUT1, OUT2 have the impurity region 40 along all its four sides except the portion located at the comer of the chip. The control terminals Ctl-1, Ctl-2 have the impurity region 40 along its four sides of the irregular pentagon except the portion located at the comer of the chip and the portion used for the connection to the resistors R1, R2. Each peripheral portion of the connecting pads, which is not provided with the impurity region 40, is located near the edge of the chip and is free from low isolation caused by the high frequency signal leakage due to the extension of the depletion layer since there is enough separation from the neighboring connecting pads and circuit wiring.

The use of the n+ impurity region 40 makes it possible to bring the elements of the switching device closer to each other. Accordingly, some extra space is made available to allow some of the elements to occupy a larger area. Thus, the switching device of FIG. 4 can occupy only the same surface area as the switching device of non-mirror configuration, i.e. the control terminals and the output terminals are connected between the closest neighbors. In other words, the chip size of the embodiment is about 0.37×0.30 mm$^2$.

Figure 6:
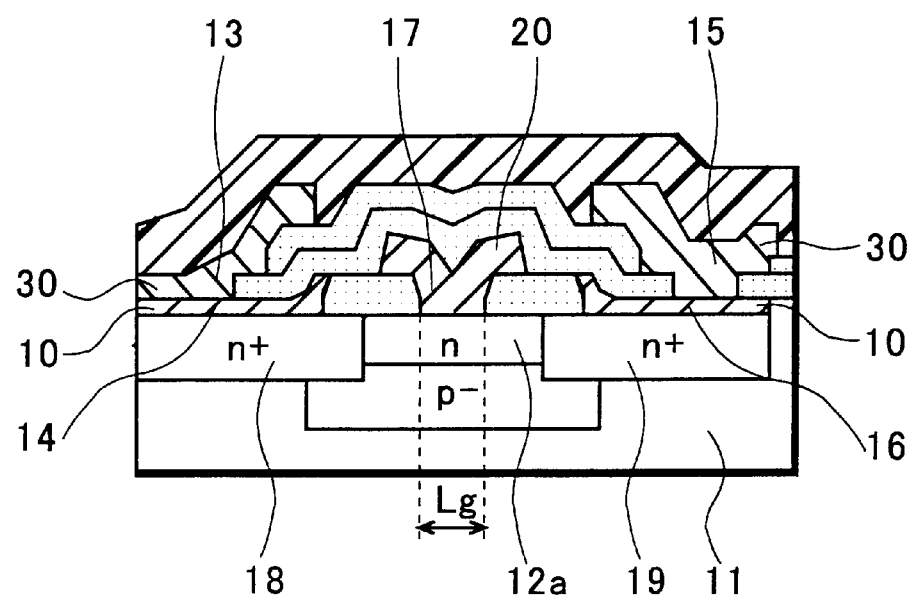
FIG. 6 is a cross-sectional view of the switching device of the second embodiment cut along line B—B in FIG. 4.

FIG. 6 shows an cross-sectional view of FET2 of the second embodiment cut along line B—B in FIG. 4. FET2 has a n-type channel region 12, a source region 18 and a drain region 19, both of which are of a n+-type high impurity region and formed at respective ends of the channel region 12. The gate electrode 17 is formed on the channel region 12, and the drain electrode 16 and the source electrode 14 of the first layer, both of which are made of ohmic metal layer 10, are formed on the n+-type high concentration regions 18, 19. The drain electrode 15 and the source electrode 13 of the third layer, both of which are made of the pad metal layer 30, are formed on the first layer electrodes 14, 16. The pad metal layer 30 also serves as wiring lines for connecting elements of FET. The n+ impurity region 40 may be formed at the same processing step as the formation of the n+ type high impurity region for the source and drain regions 18, 19. Alternatively, the n+ impurity region 40 may be formed at a processing step different from that of formation of the source and drain regions 18, 19.

The switching device of this embodiment has several advantages. First, the device size can be as small as that of non-mirror configuration even though the switching device has a mirror configuration. Accordingly, the device can be housed in a SMCP6 package (1.6×1.6×0.75 mm$^3$). This is achieved by placing the resistors connecting the control terminals and the gate electrodes of FETs underneath the pad metal layer extending from the common input terminal, and further by expanding the FET in one direction so that the size of the FETs reduces in the direction perpendicular to the direction of FET expansion. Second, the switching device can be used as an RF switch in the field of Spread Spectrum Communication using 2.4 GHz ISM Band (Industrial Scientific and Medical frequency Band).

The above is a detailed description of particular embodiments of the invention which is not intended to limit the invention to the embodiments described. It is recognized that modifications within the scope of the invention will occur to a person skilled in the art. Such modifications and equivalents of the invention are intended for inclusion within the scope of this invention.

What is claimed is:

1. A semiconductor switching device comprising:
   a first field effect transistor and a second field effect transistor each comprising a source electrode, a gate electrode and a drain electrode, which are formed on a channel layer of the respective transistor;
   a common input terminal connected to the source electrode or the drain electrode of the first transistor and connected to the source electrode or the drain electrode of the second transistor;
   a first output terminal connected to the source electrode or the drain electrode of the first transistor which is not connected to the common input terminal;
   a second output terminal connected to the source electrode or the drain electrode of the second transistor which is not connected to the common input terminal;
   a first control terminal and a second control terminal;
   a first resistor connecting the second control terminal and the gate electrode of the first transistor; and
   a second resistor connecting the first control terminal and the gate electrode of the second transistor, wherein
   the gate electrodes of the first transistor and the second transistor receive control signals so that one of the transistors opens as a switching element and the other of the transistors closes as another switching element, and
   at least a portion of the first resistor and at least a portion of the second resistor are disposed between the first and second transistors and the common input terminal.

2. A semiconductor switching device comprising:
   a first field effect transistor and a second field effect transistor each comprising a source electrode, a gate electrode and a drain electrode, which are formed on a channel layer of the respective transistor;
   a common input terminal connected to the source electrode or the drain electrode of the first transistor via a pad metal layer and connected to the source electrode or the drain electrode of the second transistor via the pad metal layer;
   a first output terminal connected to the source electrode or the drain electrode of the first transistor which is not connected to the common input terminal;
   a second output terminal connected to the source electrode or the drain electrode of the second transistor which is not connected to the common input terminal;

a first control terminal and a second control terminal;

a first resistor connecting the second control terminal and the gate electrode of the first transistor; and a second resistor connecting the first control terminal and the gate electrode of the second transistor, wherein the gate electrodes of the first transistor and the second transistor receive control signals so that one of the transistors opens as a switching element and the other of the transistors closes as another switching element, and at least a portion of the first resistor and at least a portion of the second resistor are disposed underneath the pad metal layer.

3. The semiconductor switching device of claims 1 or 2, wherein the first control terminal and the first output terminal are disposed closer to the first transistor than to the second transistor and the second control terminal and the second output terminal are disposed closer to the second transistor than to the first transistor.

4. The semiconductor switching device of claims 1 or 2, wherein the first and second resistors are made of an impurity region.

5. The semiconductor switching device of claim 4, wherein the impurity region is the same impurity region as a source region and a drain region of the first and second transistors.

6. A semiconductor switching device comprising:

a first field effect transistor and a second field effect transistor each comprising a source electrode, a gate electrode and a drain electrode, which are formed on a channel layer of the respective transistor;

a common input terminal connected to the source electrode or the drain electrode of the first transistor and connected to the source electrode or the drain electrode of the second transistor;

a first output terminal connected to the source electrode or the drain electrode of the first transistor which is not connected to the common input terminal;

a second output terminal connected to the source electrode or the drain electrode of the second transistor which is not connected to the common input terminal;

a first control terminal and a second control terminal;

a first resistor connecting the second control terminal and the gate electrode of the first transistor; and a second resistor connecting the first control terminal and the gate electrode of the second transistor, wherein the gate electrodes of the first transistor and the second transistor receive control signals so that one of the transistors opens as a switching element and the other of the transistors closes as another switching element, at least a portion of the first resistor and at least a portion of the second resistor are disposed between the first and second transistors and the common input terminal, the first control terminal and the first output terminal are disposed closer to the first transistor than to the second transistor and the second control terminal and the second output terminal are disposed closer to the second transistor than to the first transistor, and a portion of the first transistor is disposed between the first control terminal and the first output terminal, or a portion of the second transistor is disposed between the second control terminal and the second output terminal.

7. The semiconductor switching device of claim 6, wherein the first and second resistors are made of a first impurity region.

8. The semiconductor switching device of claim 6, further comprising an impurity region, wherein the impurity region is disposed under the common input terminal, the first control terminal, the second control terminal, the first output terminal, the second output terminal or a wiring layer of the first transistor or the second transistor.

9. The semiconductor switching device of claim 8, wherein the impurity region covers an entire bottom surface of the common input terminal, the first control terminal, the second control terminal, the first output terminal, the second output terminal or the wiring layer of the first transistor or the second transistor, or the impurity region covers a peripheral portion of a bottom surface of the common input terminal, the first control terminal, the second control terminal, the first output terminal, the second output terminal or the wiring layer of the first transistor or the second transistor.

10. The semiconductor switching device of claim 7, further comprising a second impurity region, wherein the second impurity region is disposed under the common input terminal, the first control terminal, the second control terminal, the first output terminal, the second output terminal or a wiring layer of the first transistor or the second transistor.

11. The semiconductor switching device of claim 10, wherein a separation among portions of the first impurity region, among portions of the second impurity region, or among the first and second impurity regions assures a predetermined isolation.

12. The semiconductor switching device of claim 10, wherein the first and second impurity regions are a same impurity region as a source region or a drain region of the first and second transistors.

* * * * *